United States Patent
Kim et al.

(10) Patent No.: US 11,063,237 B2
(45) Date of Patent: Jul. 13, 2021

(54) FLEXIBLE ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Sooyoun Kim, Yongin-si (KR); Seunghun Kim, Yongin-si (KR); Wooyong Sung, Yongin-si (KR); Seungyong Song, Yongin-si (KR); Taehoon Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 120 days.

(21) Appl. No.: 15/790,118

(22) Filed: Oct. 23, 2017

(65) Prior Publication Data

US 2018/0159075 A1 Jun. 7, 2018

(30) Foreign Application Priority Data

Dec. 2, 2016 (KR) .......................... 10-2016-0163904

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/1218* (2013.01); *H01L 27/1225* (2013.01); *H01L 27/1248* (2013.01); *H01L 27/1262* (2013.01); *H01L 27/3258* (2013.01); *H01L 27/3262* (2013.01); *H01L 29/7869* (2013.01);
(Continued)

(58) Field of Classification Search
CPC . H01L 51/50–56; H01L 27/3244–3279; H01L 27/1248; H01L 27/1262; H01L 51/5253; H01L 51/5256; H01L 51/097; H01L 51/56; H01L 27/3258; H01L 27/1225; H01L 27/3262; H01L 27/3246; H01L 2251/5338; H01L 2227/323
See application file for complete search history.

(56) References Cited

U.S. PATENT DOCUMENTS

| | | | | |
|---|---|---|---|---|
| 2003/0164679 | A1* | 9/2003 | Hamano | H01L 51/5271 313/504 |
| 2005/0099369 | A1* | 5/2005 | Lee | H01L 27/3279 345/76 |

(Continued)

FOREIGN PATENT DOCUMENTS

| | | |
|---|---|---|
| KR | 1020150032569 A | 3/2015 |
| KR | 1020160059053 A | 5/2016 |

(Continued)

*Primary Examiner* — Monica D Harrison
*Assistant Examiner* — John Lin
(74) *Attorney, Agent, or Firm* — Cantor Colburn LLP

(57) ABSTRACT

A flexible organic light-emitting display device includes a display panel which displays an image with light, including: an organic light-emitting device which emits the light; and a plurality of organic layers stacked around the organic light-emitting device, a portion of the plurality of organic layers being exposed outside the display panel, and a metal oxide layer on the display panel, the metal oxide layer contacting the portions of the plurality of organic layers exposed outside the display panel.

9 Claims, 4 Drawing Sheets

(51) Int. Cl.
   *H01L 51/00* (2006.01)
   *H01L 29/786* (2006.01)
   *H01L 51/56* (2006.01)
   *H01L 27/12* (2006.01)

(52) U.S. Cl.
   CPC .... *H01L 29/78603* (2013.01); *H01L 51/0097* (2013.01); *H01L 51/56* (2013.01); *H01L 27/3246* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 2011/0169720 A1* | 7/2011 | Hwang | H01L 27/326 345/76 |
| 2011/0221661 A1* | 9/2011 | Yoon | H01L 27/3272 345/76 |
| 2015/0090995 A1 | 4/2015 | Jung et al. | |
| 2015/0123092 A1 | 5/2015 | Kikuchi et al. | |
| 2015/0162568 A1 | 6/2015 | Bai et al. | |
| 2016/0164026 A1 | 6/2016 | Kim et al. | |
| 2016/0209955 A1 | 7/2016 | Kim et al. | |

FOREIGN PATENT DOCUMENTS

| | | |
|---|---|---|
| KR | 1020160069073 A | 6/2016 |
| KR | 1020160089946 A | 7/2016 |

\* cited by examiner

FLEXIBLE ORGANIC LIGHT-EMITTING DISPLAY DEVICE AND METHOD OF MANUFACTURING THE SAME

This application claims priority to Korean Patent Application No. 10-2016-0163904, filed on Dec. 2, 2016, and all the benefits accruing therefrom under 35 U.S.C. § 119, the content of which in its entirety is herein incorporated by reference.

BACKGROUND

1. Field

One or more embodiments relate to flexible organic light-emitting display devices, and more particularly, to an organic light-emitting display device having an improved structure for reducing or effectively preventing infiltration of oxygen or moisture thereto, and a method of manufacturing the organic light-emitting display device.

2. Description of the Related Art

General flexible organic light-emitting display devices include a display panel including a display unit on a flexible substrate, and thus a display panel of the display unit is bendable to have a moderate curvature as necessary.

The display unit includes an organic light-emitting device having an emission layer including an organic material between an anode and a cathode. When voltages are respectively applied to the anode and the cathode, holes injected into the anode and electrons injected into the cathode recombine together in the emission layer to generate excitons. When the excitons fall from an excited state to a ground state, light emission occurs, and at the same time, an image is realized.

SUMMARY

When an emission layer of a display unit in an organic light-emitting device, comes in contact with moisture or oxygen, emission properties immediately degrade, and thus a structure for reducing or effectively preventing this degradation is desired.

In particular, the organic light-emitting device may include an organic layer therein. When an end portion of the organic layer is exposed to the atmosphere through a manufacturing process such as cutting or hole formation, a possibility of infiltration of moisture and oxygen through the exposed end portion increases. Thus, measures to reduce or effectively prevent infiltration of moisture and oxygen are desired.

One or more embodiments include a flexible organic light-emitting display device capable of effectively preventing infiltration of moisture and oxygen through an end portion of an organic layer in the flexible organic light-emitting display device, and a method of manufacturing the flexible organic light-emitting display device.

Additional features will be set forth in part in the description which follows and, in part, will be apparent from the description, or may be learned by practice of the presented embodiments.

According to one or more embodiments, a flexible organic light-emitting display device includes a display panel which displays an image with light, including: an organic light-emitting device which emits the light; and a plurality of organic layers stacked around the organic light-emitting device, a portion of the plurality of organic layers being exposed outside the display panel, and a metal oxide layer on the display panel, the metal oxide layer contacting the portions of the plurality of organic layers exposed outside the display panel.

The plurality of organic layers may include an organic base substrate on which the organic light-emitting device is disposed, an organic pixel-defining layer which defines a pixel region of the organic light-emitting device, on the organic base substrate, an organic insulation layer of a thin film transistor connected to the organic light-emitting device, on the organic base substrate, and an organic encapsulation layer of a thin film encapsulation layer which covers the organic light-emitting device, the organic encapsulation layer disposed opposite to the organic base substrate with respect to the organic light-emitting device.

A light-emitting region may be provided in plurality each including the thin film transistor and the organic light-emitting device. The flexible organic light-emitting display device may further include between light-emitting regions adjacent to each other, an accommodation hole at which end portions of each of the organic pixel-defining layer, the organic insulation layer and the organic encapsulation layer are exposed to outside the display panel. At the accommodation hole, the metal oxide layer may be on each of the exposed end portions of the organic pixel-defining layer, the organic insulation layer and the organic encapsulation layer.

A light-emitting region may be provided in plurality each including the thin film transistor and the organic light-emitting device. The flexible organic light-emitting display device may further include between light-emitting regions adjacent to each other, an accommodation hole at which a portion of the organic base substrate is exposed to outside the display panel, and the metal oxide layer may be on the exposed portion of the organic base substrate.

The thin film transistor may include an active layer on the organic base substrate, a gate insulating layer covering the active layer, a gate electrode on the gate insulating layer and facing the active layer, an interlayer insulating layer covering the gate electrode, a source electrode and a drain electrode on the interlayer insulating layer to be respectively connected to different portions of the active layer, and a via layer covering the source electrode and the drain electrode. Each of the gate insulating layer, the interlayer insulating layer and the via layer may extend from the thin film transistor to outside the thin film transistor. The organic insulation layer may include the gate insulating layer, the interlayer insulating layer and the via layer. A portion of the organic insulation layer including the gate insulating layer, the interlayer insulating layer and the via layer may be exposed to outside the display panel. The metal oxide layer may be on the exposed portion of the organic insulation layer including the gate insulating layer, the interlayer insulating layer and the via layer.

A portion of the organic pixel-defining layer may be exposed to outside the display panel, and the metal oxide infiltrated layer may be on the exposed portion of the organic pixel-defining layer.

A portion of the organic encapsulation layer may be exposed to outside the display panel, and the metal oxide layer may be on the organic encapsulation layer.

According to one or more embodiments, a method of manufacturing a flexible organic light-emitting display device includes: providing a display panel which displays an image with light, including: providing an organic light-emitting device which emits the light, and stacking a plurality of organic layers around the organic light-emitting device, portions of the plurality of organic layers being exposed to outside the display panel; and forming a metal oxide layer on the exposed portions of the plurality of organic layers, by using a sequential vapor deposition method.

The plurality of organic layers may include an organic base substrate on which the organic light-emitting device is disposed, an organic pixel-defining layer which defines a pixel region of the organic light-emitting device, on the organic base substrate, an organic insulation layer of a thin film transistor connected to the organic light-emitting device, on the organic base substrate, and an organic encapsulation layer of a thin film encapsulation layer which covers the organic light-emitting device, the organic encapsulation layer disposed opposite to the organic base substrate with respect to the light-emitting device.

The providing a display panel may further include defining a light-emitting region in plurality each including the thin film transistor and the organic light-emitting device, on the organic base substrate, the stacking the plurality of organic layers may include forming an accommodation hole at an area between adjacent light-emitting regions, by removing a portion of the plurality of organic layers of the display panel, at the area between adjacent light-emitting regions, the forming the accommodation hole may include exposing to outside the display panel, at the area between adjacent light-emitting regions, a portion of the organic base substrate and the portions of the plurality of organic layers, and the forming the metal oxide layer may dispose the metal oxide layer on the exposed portions of the plurality of organic layers.

The metal oxide layer may be formed on the exposed portion of the organic base layer.

The thin film transistor may include an active layer on the organic base substrate, a gate insulating layer covering the active layer, a gate electrode on the gate insulating layer and facing the active layer, an interlayer insulating layer covering the gate electrode, a source electrode and a drain electrode on the interlayer insulating layer to be respectively connected to different portions of the active layer, and a via layer covering the source electrode and the drain electrode. Each of the gate insulating layer, the interlayer insulating layer and the via layer may extend from the thin film transistor to outside the thin film transistor. The organic insulation layer of the display panel may include the gate insulating layer, the interlayer insulating layer and the via layer. A portion of the organic insulation layer including the gate insulating layer, the interlayer insulating layer and the via layer may be exposed to outside the display panel. The metal oxide layer may be formed on the exposed portion of the organic insulation layer including the gate insulating layer, the interlayer insulating layer and the via layer.

A portion of the organic pixel-defining layer may be exposed to outside the display panel, and the metal oxide infiltrated layer may be formed on the exposed portion of the organic pixel-defining layer.

A portion of the organic encapsulation layer may be exposed to outside the display panel, and the metal oxide layer may be formed on the exposed portion of the organic encapsulation organic layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
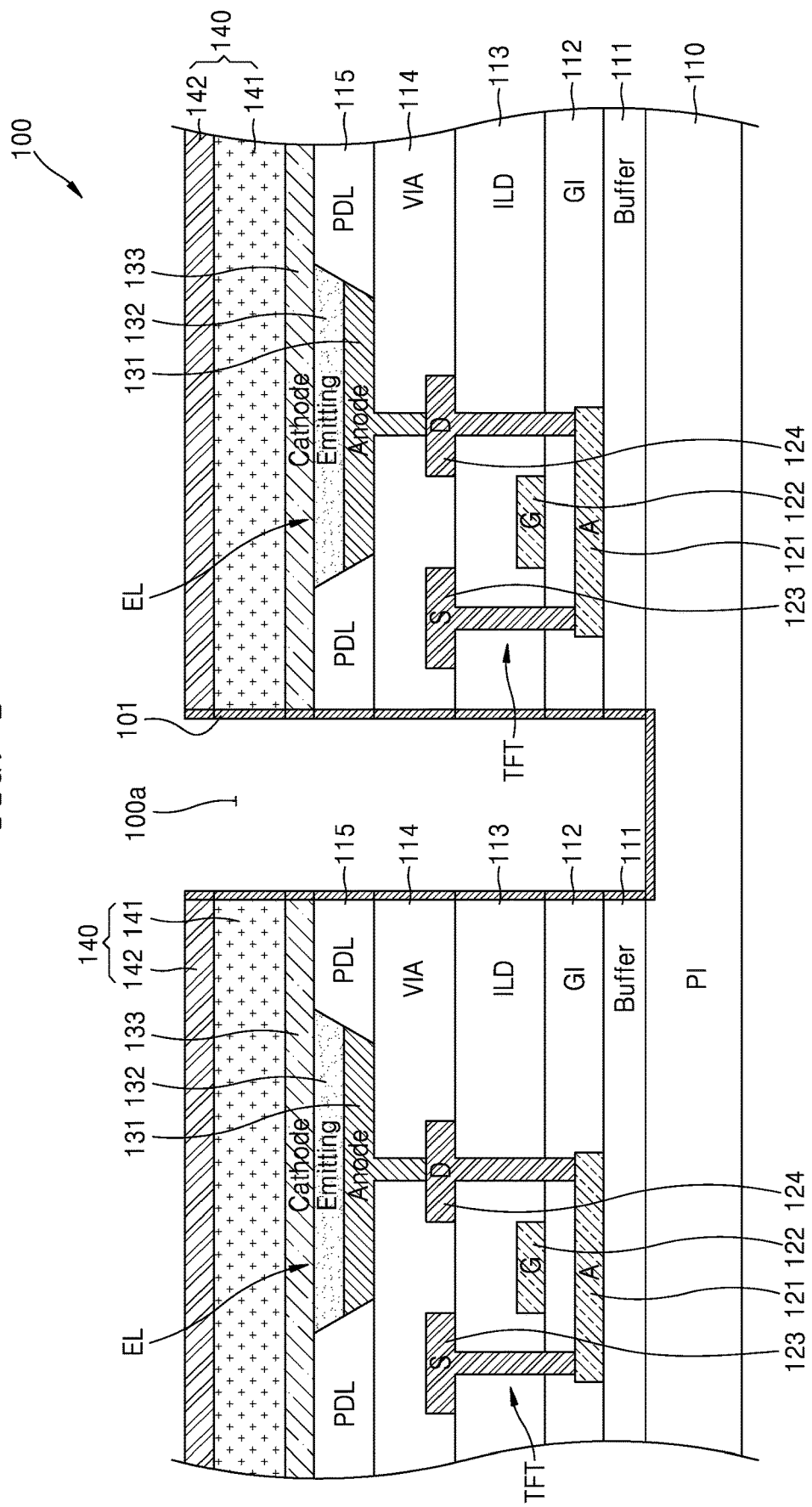
FIG. 1 is an enlarged cross-sectional view of an embodiment of a flexible organic light-emitting display device according to the invention.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Expressions such as "at least one of", when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being related to another element such as being "on" another layer, region, or element, it can be directly or indirectly formed on the other layer, region, or element. That is, for example, intervening layers, regions, or elements may be present. In contrast, when a layer, region, or element is referred to as being related to another element such as being "directly on" another layer, region, or element, no intervening layers, regions, or elements may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that when a layer, region, or component is referred to as being related to another layer, region, or component such as being "connected" to another layer, region, or component, it may be physically or electrically connected to the other layer, region, or component.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is an enlarged cross-sectional view of an embodiment of a flexible organic light-emitting display device according to the invention.

One or more embodiment of the flexible organic light-emitting display device includes a display panel which displays an image with light. The display panel and/or the overall flexible organic light-emitting display device is disposed in a plane defined by first and second directions which cross each other. A thickness direction of the display panel and/or the overall flexible organic light-emitting display device extends in a third direction, crossing each of the first and second directions, including but not limited to being orthogonal thereto. In FIG. 1, the thickness (third) direction is vertical, while the first and/or second direction is horizontal.

The flexible organic light-emitting display device includes, as the display panel, a flexible panel 100 capable of being flexibly bent, and may be used, for example, as a display panel in electronic devices such as a mobile phone. The flexible panel 100 is a structure in which a switching element such as a thin film transistor TFT and an organic light-emitting device EL for realizing an image, and an encapsulation layer 140 that covers and protects the thin film transistor TFT and the organic light-emitting device EL are stacked on a relatively flexible base organic layer 110. The thin film transistor TFT controls or drives the organic light-emitting device EL to generate and emit light used in forming an image displayed by the flexible organic light-emitting display device. The thin film transistor TFT and the organic light-emitting device EL may be provided in plurality on the flexible base organic layer 110.

Since the flexible base organic layer 110, which is effectively a flexible substrate, is used instead of a relatively rigid glass substrate, the flexible panel 100 may be bent or rolled. The base organic layer 110 may include or be formed using, for example, polyimide (PI). Although only two thin film transistors TFT and two organic light-emitting devices EL are illustrated in FIG. 1 for convenience of illustration, a relatively greater number of thin film transistors TFT and/or organic light-emitting devices EL may be arranged on the base organic layer 110.

Reference numeral 100a indicates an accommodation hole disposed or formed between light-emitting regions of the display panel and/or flexible organic light-emitting display device, each including a thin film transistor TFT and an organic light-emitting device EL. The light-emitting regions may correspond to pixels of the display panel and/or flexible organic light-emitting display device at which an image is generated and/or displayed thereby. In an embodiment, for example, the accommodation hole 100a serves as a hole for installing an input or output device such as a camera lens or the like of a mobile phone. The view in FIG. 1 may represent the accommodation hole 100a relative to the first direction and the second direction, such that the accommodation hole 100a may be a discrete opening of the flexible panel 100 in a top plan view (e.g., a view in a direction normal to the plane defined by the first and second directions.

However, in an embodiment of manufacturing the flexible organic light-emitting display device, since the accommodation hole 100a is formed by piercing layers of the flexible panel 100, portions of organic layers of the flexible panel 100, which are vulnerable to infiltration of oxygen and moisture, may be exposed to the atmosphere at an area outside the flexible panel 100 and/or the flexible organic light-emitting display device. A method of reducing or effectively solving this problem will be described below.

An active (A) layer 121 of the thin film transistor TFT is disposed or formed on a buffer layer 111 that is adjacent to the base organic layer 110. Source and drain regions doped with N-type or P-type impurities at a relatively high concentration are disposed or formed by or at opposing ends of the active layer 121, respectively. The active layer 121 may include an oxide semiconductor. In an embodiment, for example, the active layer 121 may include an oxide semiconductor. The oxide semiconductor may include an oxide of a material selected from Group 4, 12, 13, and 14 metal elements (such as, zinc (Zn), indium (In), gallium (Ga), stannum (Sn), cadmium (Cd), germanium (Ge), and hafnium (Hf)) and a combination thereof. In an embodiment, for example, the active layer 121 may include G-I—Z—O [(In2O3)a(Ga2O3)b(ZnO)c], where a, b and c are real numbers that respectively satisfy and c>0.

A gate (G) electrode 122 is disposed or formed over the active layer 121 with a gate insulating (GI) layer 112 between the gate electrode 122 and the active layer 121. A source (S) electrode 123 and a drain (D) electrode 124 are disposed or formed over the gate electrode 122, and the source electrode 123 and the drain electrode 124 are respectively connected to the source and drain regions of the active layer 121. An interlayer insulating (ILD) layer 113 is included between the gate electrode 122, and each of the source electrode 123 and the drain electrode 124. A via (VIA) layer 114 is interposed between an anode 131 of the organic light-emitting device EL, and each of the source electrode 123 and the drain electrode 124. The gate insulating layer 112, the interlayer insulating layer 113 and the via layer 114 each include an organic material. The gate insulating layer 112, the interlayer insulating layer 113 and the via layer 114 together form a plurality of organic layers that together function as an insulating layer in the thin film transistor TFT.

Reference numeral 115 indicates a pixel-defining layer (PDL) and the organic light-emitting device EL is disposed or formed in an opening of the pixel-defining layer 115. The pixel-defining layer 115 is an organic layer including polyimide material or the like.

The organic light-emitting device EL generates and emits light under control of the thin film transistor TFT, to display predetermined image information. The organic light-emitting device EL may emit colored light such as red, green and blue light, as electrical current flows into or through the organic light-emitting device EL. The organic light-emitting device EL includes the anode 131, which is connected to the drain electrode 124 of the thin film transistor TFT and receives a positive power voltage from the drain electrode 124, a cathode 133, which commonly covers the light emitting regions and supplies a negative power voltage to the organic light-emitting device EL, and an emission layer 132, which is between the anode 131 and the cathode 133 to emit light.

A hole injection layer ("HIL"), a hole transport layer ("HTL"), an electron transport layer ("ETL"), an electron injection layer ("EIL"), and the like may be stacked within or adjacent to the emission layer 132.

In an embodiment, the emission layer 132 may be discretely disposed or formed in each pixel to form a single unit pixel that includes a collection of pixels that individually emit red, green and blue light beams. The emission layers 132 disposed or formed in the pixels may be spaced apart from one another, such as along the first and/or second directions. Within a pixel, the pixel-defining layer 115 may define a pixel region at which light is generated and emitted.

Alternatively, an emission layer may be commonly disposed or formed over an entirety of the pixels and/or unit pixels, regardless of locations of the pixels. In this case, the emission layer 132 may be formed by stacking a light-emitting substance that emits a red light, a light-emitting substance that emits a green light and a light-emitting substance that emits a blue light on one another, or by mixing a light-emitting substance that emits a red light, a light-emitting substance that emits a green light and a light-emitting substance that emits a blue light. Any combination of other various colors that is capable of emitting a white light may be utilized.

The flexible panel 100 may further include a color converting layer and/or a color filter that coverts the white light generated and emitted by the emission layer 132 into a light of a corresponding color.

The encapsulation layer 140 may be disposed or formed on the cathode 133, to form an outer surface of the flexible panel 100. The encapsulation layer 140 may include an encapsulation organic layer 141 and an encapsulation inorganic layer 142 that are alternately stacked on each other.

As described above, in an embodiment of manufacturing the flexible organic light-emitting display device, the accommodation hole 100a is formed by piercing through layers at an area between the light-emitting regions, to form an empty space at the area. The pre-pierced area includes no thin film transistor TFT and no organic light-emitting device EL, but may include one or all layers of the flexible panel 100 except those at the thin film transistor TFT and organic light-emitting device EL. The pre-pierced area may particularly include the encapsulation layer 140 completely covering organic layers of the flexible panel 100. A camera lens or the like of a mobile phone, may be disposed at the empty space formed in the flexible panel 100. In forming the empty space at the area between the light-emitting regions, portions of the organic layers once completely covered by the encapsulation layer 140 are exposed to the atmosphere due to the formation of the accommodation hole 100a.

The base organic layer 110 is an organic layer, the gate insulating layer 112, the interlayer insulating layer 113 and the via layer 114, which are insulating layers of the thin film transistor TFT, are also organic layers, and the pixel-defining layer 115 of the light-emitting device EL and the encapsulation organic layer 141 of the encapsulation layer 140 are also organic layers. When the accommodation hole 100a is not yet formed in these layers, these layers are covered with the encapsulation inorganic layer 142 of the encapsulation layer 140, and infiltration of oxygen and moisture may be reduced or effectively prevented by the encapsulation inorganic layer 142. In an embodiment of manufacturing the flexible organic light-emitting display device, a glass substrate (not shown), which is a carrier substrate, is attached to an exposed bottom surface of the base organic layer 110 during manufacturing processes, the glass substrate may reduce or effectively prevent infiltration of oxygen and moisture to the base organic layer 110 during manufacturing. Since the glass substrate is detached later in manufacturing the flexible organic light-emitting display device and a protective film is immediately attached to the base organic layer 110, the infiltration of oxygen and moisture from the bottom surface of the base organic layer 110 is again reduced or effectively prevented.

However, when the accommodation hole 100a is formed by piercing as described above, end portions of all the organic layers at the accommodation hole 100a are exposed to the atmosphere outside the flexible panel 100 and/or the flexible organic light-emitting display device. Therefore, if the end portions of the organic layers are left in this exposed state, oxygen and moisture may relatively easily infiltrate through the end portions exposed to the atmosphere, and thus the organic light-emitting device EL surrounded by the exposed organic layers may be deteriorated.

Therefore, in one or more embodiment according to the invention, in order to prevent infiltration and oxygen to the exposed organic layers, a metal oxide material layer 101 is disposed or formed on an end surface of an organic layer at the accommodation hole 100a and exposed to the atmosphere at the accommodation hole 100a. The metal oxide material layer 101 is in contact with the end surface of the organic layer exposed to outside the flexible panel 100. The exposed end surface of the organic layer is not exposed to the atmosphere since the metal oxide material layer 101 covers the end surface.

In an embodiment of manufacturing the flexible organic light-emitting display device, the metal oxide material layer 101 may be is formed by infiltrating metal oxide, for example, AlOx, TiOx, ZrOx, or Hf, into a surface according to a sequential vapor deposition method. The metal oxide infiltrated layer 101 functions as a barrier layer that prevents infiltration of moisture and oxygen toward the organic light-emitting device EL.

In the sequential vapor deposition method, a metal oxide material (infiltrated) layer is formed by diffusing metal oxide of a source gas into a minute empty space of a target organic layer. The sequential vapor deposition method is conducted by inserting a target into a processing chamber and injecting a source gas into the processing chamber for diffusing metal oxide of a source gas into a minute empty space of a target organic layer. An infiltrated layer may also be partially formed on an end portion of an inorganic layer such as the encapsulation inorganic layer 142, the cathode 133 or the buffer layer 111. However, since the inorganic material of the encapsulation inorganic layer 142, the cathode 133 or the buffer layer 111 is a relatively dense barrier layer, a metal oxide infiltrated layer is not necessarily formed thereon.

Accordingly, in an embodiment of manufacturing the flexible organic light-emitting display device, when the accommodation hole 100a is disposed or formed in the flexible panel 100 to expose the base organic layer 110 and other organic layers thereon, a resultant structure is placed in a processing chamber and a source gas is injected into the processing chamber. By the source gas injected into the processing chamber having the resultant structure therein, metal oxide is diffused and infiltrated into end portions of the organic layers 110, 112, 113, 114, 115 and 141, exposed through and at the accommodation hole 100*a*, according to the sequential vapor deposition method, and thus the metal oxide infiltrated layer 101 is formed.

As a result, even when a separate inorganic layer for reducing or effectively preventing infiltration of moisture and oxygen is not included, the metal oxide infiltrated layer 101 functions as a barrier layer similar to a separate inorganic layer functioning as a barrier layer.

Thus, the metal oxide infiltrated layer 101 effectively prevents moisture or oxygen from being infiltrated through the exposed organic layers 110, 112, 113, 114, 115, and 141 toward the organic light-emitting device EL. In addition, because no separate inorganic layers are included, suitable flexibility may be maintained, and thus flexibility that is necessary for the flexible organic light-emitting display device may be sufficiently secured.

In an embodiment of manufacturing the flexible organic light-emitting display device, where an individual flexible panel 100 is separated from another individual flexible panel 100 in a same mother substrate, such as by cutting, an outer end (or edge) portion of the flexible panel 100 may be exposed to outside the individual flexible panel 100. While not explicitly illustrated, a structure at the exposed edge portion of an individual flexible display panel 100 may be similar to that structure at the accommodation hole 100*a* in FIG. 1. Different from FIG. 1, a portion of the flexible base layer 110 may be further removed at the accommodation hole 100*a* to further expose an end portion thereof. As such, each end portion from the flexible base layer 110 through the encapsulation layer 140 may be covered with the metal oxide layer 101 in forming an individual flexible panel 100 from a mother substrate including a plurality of individual flexible panels to be separated from each other.

The flexible panel 100 of the flexible organic light-emitting display device may be manufactured as follows.

Figure 2:
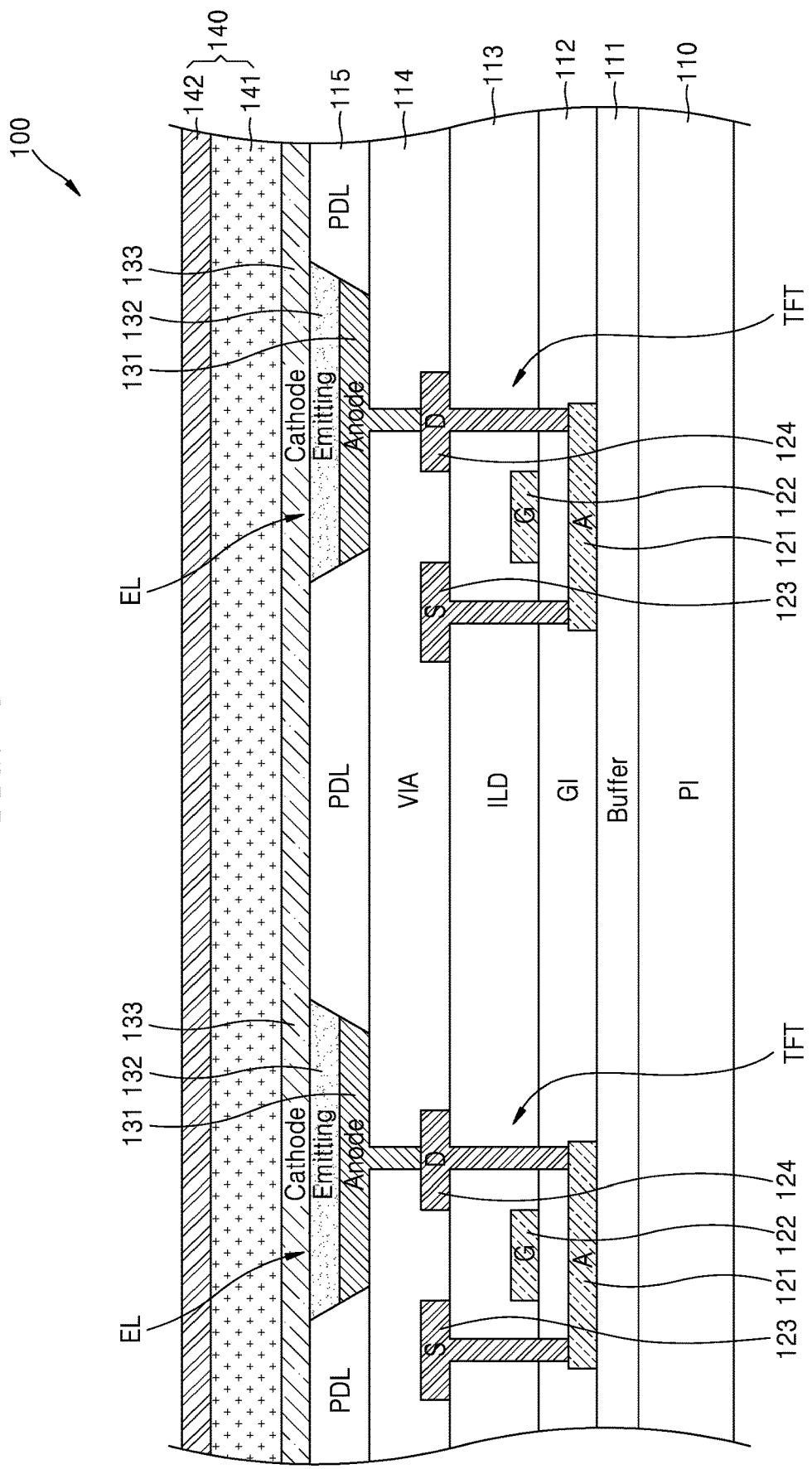
FIGS. 2 to 4 are enlarged cross-sectional views illustrating an embodiment of a process of manufacturing the flexible organic light-emitting display device shown in FIG. 1.

As shown in FIG. 2, a stack structure in which the buffer layer 111 to the encapsulation layer 140 are stacked on the base organic layer 110, is formed. At an area between the light-emitting regions, a pre-pierced area includes no thin film transistor TFT and no organic light-emitting device EL, but includes portions of other layers of the flexible panel 100 except for elements of thin film transistor TFT and organic light-emitting device EL. The pre-pierced area particularly includes the encapsulation layer 140 completely covering organic layers of the flexible panel 100, even at the area between the light-emitting regions.

Figure 3:
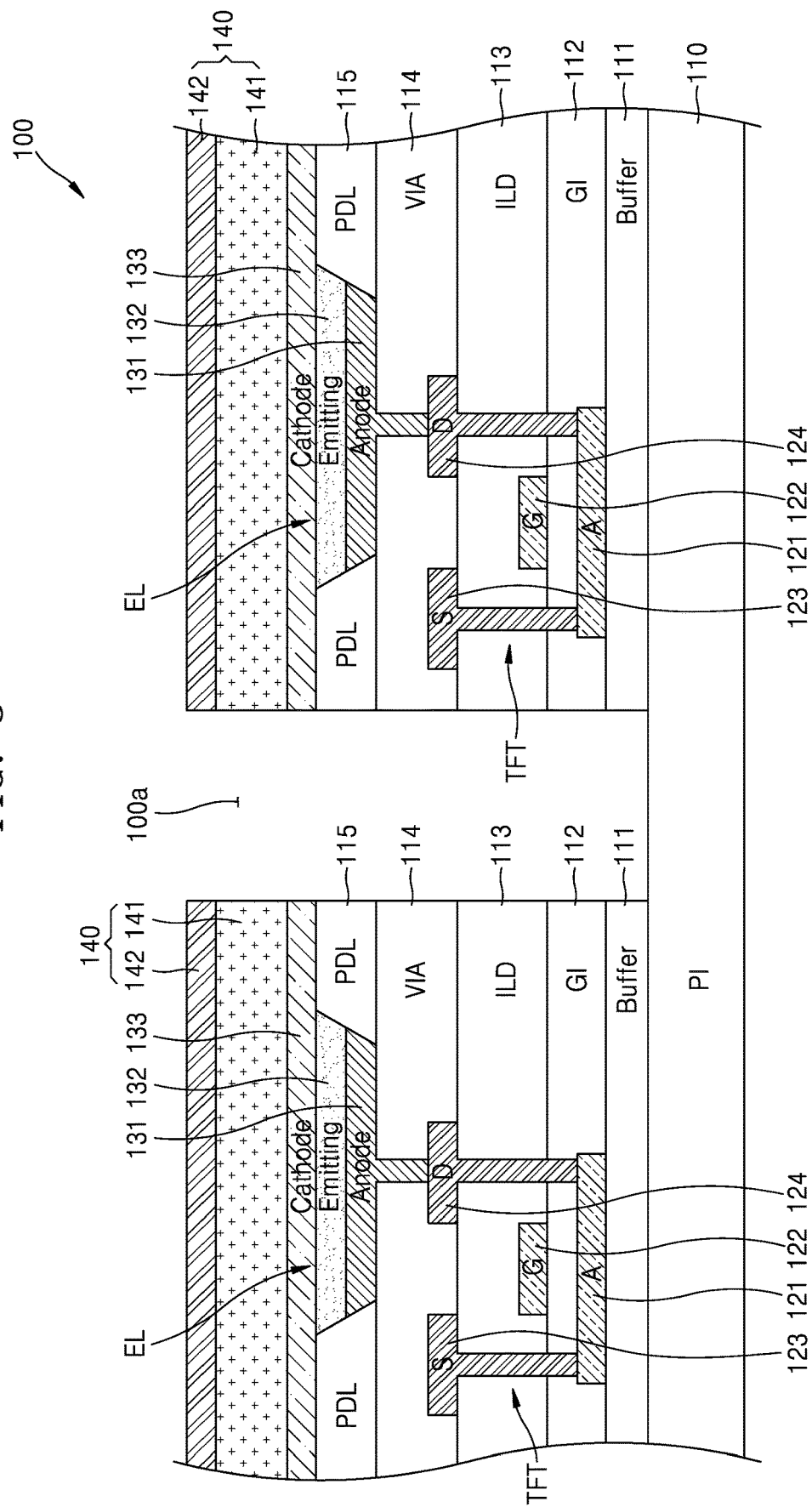

As shown in FIG. 3, the accommodation hole 100*a* is formed at the area between the light-emitting regions, to form an empty space between the light-emitting regions. Portions of the organic layers of the flexible panel 100, at the area between the light-emitting regions, are removed to form the empty space. An input or output device, such as a mobile phone camera lens or the like may be installed at the empty space between the light-emitting regions.

In forming the empty space at the area between the light-emitting regions, portions of organic layers once completely covered by the encapsulation layer 140 are exposed to the atmosphere outside the flexible panel 100 due to the formation of the accommodation hole 100*a*.

Figure 4:
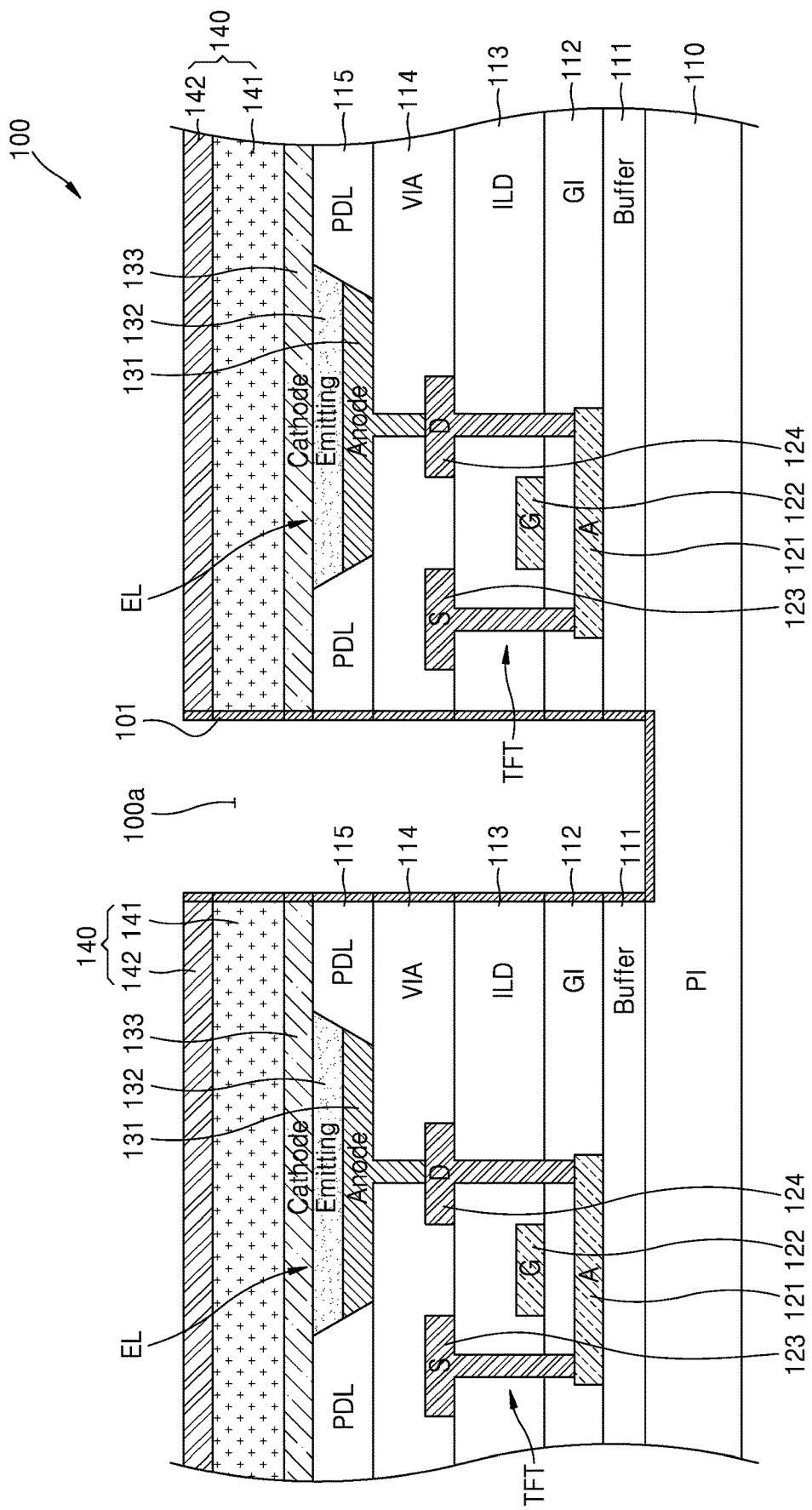

As shown in FIG. 4, a metal oxide (infiltrated layer) 101 is formed on portions of the organic layers which are exposed at the accommodation hole 100*a*.

In an embodiment of forming a flexible organic light-emitting display device, the flexible panel 100 including the exposed portions of the organic layers, is placed in a processing chamber and a source gas is injected into the processing chamber to allow metal oxide to diffuse into portions of the organic layers 110, 112, 113, 114, 115 and 141, exposed to the atmosphere at the accommodation hole 100*a*, according to a sequential vapor deposition method. Thus, the metal oxide infiltrated layer 101 is formed as shown in FIG. 4.

As a result of the metal oxide infiltrated layer 101 covering exposed portions of organic layers at the accommodation hole 100*a*, infiltration of moisture or oxygen into the organic light-emitting device EL through the exposed portions of the organic layers 110, 112, 113, 114, 115, and 141 is reduced or effectively prevented. Thus, an organic light-emitting display device with relatively stable performance and relatively low possibility of deterioration is obtained.

According to one or more embodiment of a flexible organic light-emitting display device and a method of manufacturing the same as described above, since a function of a barrier layer selectively at exposed portions of organic layers may be achieved without including a separate inorganic layer, a reliable flexible organic light-emitting display device capable of effectively preventing infiltration of oxygen or moisture thereto without losing flexibility may be realized.

In the above-described embodiments, the case where the end portions of the organic layers are exposed to the atmosphere through the accommodation hole 100*a* at an inner portion of the flexible panel 100 is exemplified. However, the function of a barrier layer may be further secured by forming a metal oxide infiltrated layer 101 on an exposed outer end portion of the flexible panel 100 by using a sequential vapor deposition method described above.

In an embodiment, for example, where an individual flexible panel 100 is separated from another individual flexible panel 100, an outer end portion of the flexible panel 100 may be exposed to the atmosphere by cutting the individual flexible panel 100 to be separated from another individual flexible panel 100. Similar to that described for FIG. 4, the function of a barrier layer may be further secured by forming a metal oxide infiltrated layer 101 on the exposed outer end portion of the individual flexible panel 100 by using the sequential vapor deposition method described above.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a display panel which displays an image with light, comprising:
   an organic light-emitting device which emits the light;
   a plurality of organic layers stacked around the organic light-emitting device;
   the plurality of organic layers comprising:
   an organic base substrate on which the organic light-emitting device is disposed, and
   an organic encapsulation layer of a thin film encapsulation layer which covers the organic light-emitting device, the organic encapsulation layer disposed opposite to the organic base substrate with respect to the organic light-emitting device;

a light-emitting region provided in plurality each including the organic light-emitting device; and an accommodation hole extended through the plurality of organic layers, the accommodation hole defined between light-emitting regions adjacent to each other, wherein end portions of the plurality of organic layers define the accommodation hole, and a metal oxide layer in the accommodation hole defined between the light-emitting regions adjacent to each other, the metal oxide layer contacting each of the end portions of the plurality of organic layers.

2. The display device of claim 1, wherein the plurality of organic layers comprise:

an organic pixel-defining layer which defines a pixel region of the organic light-emitting device, on the organic base substrate, and an organic insulation layer of a thin film transistor connected to the organic light-emitting device, on the organic base substrate.

3. The display device of claim 2, wherein end portions of each of the organic pixel-defining layer, the organic insulation layer and the organic encapsulation layer define the accommodation hole between the light-emitting regions adjacent to each other, and the metal oxide layer which is in the accommodation hole covers the end portions of the organic pixel-defining layer, the organic insulation layer and the organic encapsulation layer.

4. The display device of claim 2, wherein the accommodation hole defined between the light-emitting regions adjacent to each other extends through the plurality of organic layers to the organic base substrate, a portion of the organic base substrate defines the accommodation hole, and the metal oxide layer which is in the accommodation hole covers the portion of the organic base substrate.

5. The display device of claim 2, wherein the thin film transistor comprises:

an active layer on the organic base substrate, a gate insulating layer covering the active layer, a gate electrode on the gate insulating layer and facing the active layer, an interlayer insulating layer covering the gate electrode, a source electrode and a drain electrode on the interlayer insulating layer to be respectively connected to different portions of the active layer, and a via layer covering the source electrode and the drain electrode, each of the gate insulating layer, the interlayer insulating layer and the via layer extends from the thin film transistor to outside the thin film transistor, the organic insulation layer comprises the gate insulating layer, the interlayer insulating layer and the via layer, a portion of the organic insulation layer including the gate insulating layer, the interlayer insulating layer and the via layer defines the accommodation hole between the light-emitting regions adjacent to each other, and the metal oxide layer which is in the accommodation hole covers the portion of the organic insulation layer including the gate insulating layer, the interlayer insulating layer and the via layer.

6. The display device of claim 2, wherein a portion of the organic pixel-defining layer defines the accommodation hole between the light-emitting regions adjacent to each other, and the metal oxide layer which is in the accommodation hole covers the portion of the organic pixel-defining layer.

7. The display device of claim 2, wherein a portion of the organic encapsulation layer defines the accommodation hole between the light-emitting regions adjacent to each other, and the metal oxide layer which is in the accommodation hole covers the portion of the organic encapsulation layer.

8. The display device of claim 1, wherein the end portions of each of the plurality of organic layers define a same one of the accommodation hole.

9. A display device comprising:

a display panel which displays an image with light, comprising:

a substrate;

a plurality of organic insulating layers stacked on the substrate;

a first organic light-emitting device and a second organic light-emitting device emitting the light respectively, on the plurality of organic insulating layers;

an organic encapsulation layer of a thin film encapsulation layer which covers the first organic light-emitting device and the second organic light-emitting device, the organic encapsulation layer disposed opposite to the substrate with respect to the first organic light-emitting device and the second organic light-emitting device; and an accommodation hole extended through the plurality of organic insulating layers and the organic encapsulation layer, the accommodation hole defined between the first organic light-emitting device and the second organic light-emitting device;

wherein end portions of the plurality of organic insulating layers and an end portion of the organic encapsulation layer define the accommodation hole, and a metal oxide layer in the accommodation hole defined between the first organic light-emitting device and the second organic light-emitting device, the metal oxide layer contacting each of the end portions of the plurality of organic insulating layers and the end portion of the organic encapsulation layer.

* * * * *